(12) United States Patent
Medic et al.

(10) Patent No.: US 11,973,063 B2
(45) Date of Patent: Apr. 30, 2024

(54) SEMICONDUCTOR PACKAGE WITH LOW PARASITIC CONNECTION TO PASSIVE DEVICE

(71) Applicant: Infineon Technologies AG, Neubiberg (DE)

(72) Inventors: Urban Medic, Logatec (SI); Eung San Cho, Torrance, CA (US); Tomasz Naeve, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 358 days.

(21) Appl. No.: 17/379,529

(22) Filed: Jul. 19, 2021

(65) Prior Publication Data
US 2023/0017391 A1    Jan. 19, 2023

(51) Int. Cl.
| | | |
|---|---|---|
| *H01L 23/00* | (2006.01) | |
| *H01L 23/538* | (2006.01) | |
| *H01L 23/64* | (2006.01) | |
| *H01L 25/00* | (2006.01) | |
| *H01L 25/07* | (2006.01) | |

(52) U.S. Cl.
CPC ........ *H01L 25/072* (2013.01); *H01L 23/5384* (2013.01); *H01L 23/642* (2013.01); *H01L 24/04* (2013.01); *H01L 24/40* (2013.01); *H01L 24/84* (2013.01); *H01L 25/50* (2013.01); *H01L 2224/40137* (2013.01); *H01L 2224/80801* (2013.01)

(58) Field of Classification Search
CPC ......... H01L 24/48; H01L 24/40; H01L 24/04; H01L 2224/80801; H01L 2224/40137; H01L 25/50; H01L 25/072; H01L 23/5384
See application file for complete search history.

(56) References Cited

U.S. PATENT DOCUMENTS

| | | | |
|---|---|---|---|
| 10,454,472 B2 | 10/2019 | Reusch et al. | |
| 10,756,649 B2 | 8/2020 | Chung et al. | |
| 2004/0227231 A1 | 11/2004 | Maly et al. | |
| 2015/0116022 A1 | 4/2015 | Hughes et al. | |
| 2019/0229618 A1 | 7/2019 | Parto | |
| 2020/0135619 A1* | 4/2020 | Dinkel | H01L 24/40 |
| 2020/0219846 A1 | 7/2020 | Ji et al. | |

FOREIGN PATENT DOCUMENTS

DE    102018202484 A1    8/2019

* cited by examiner

*Primary Examiner* — Hoa B Trinh

(74) *Attorney, Agent, or Firm* — Murphy, Bilak & Homiller, PLLC

(57) ABSTRACT

A semiconductor assembly includes a semiconductor package that includes first and second transistor dies embedded within a package body, the first and second transistor dies being arranged laterally side by side within the package body such that a first load terminal of the first transistor die faces an upper surface of the package body and such that a second load terminal of the second transistor die faces the upper surface of the package body, and a discrete capacitor mounted on the semiconductor package such that a first terminal of the discrete capacitor is directly over and electrically connected to the first load terminal of the first semiconductor die and such that a second terminal of the discrete capacitor is directly over and electrically connected with the second load terminal of the second semiconductor die.

12 Claims, 11 Drawing Sheets

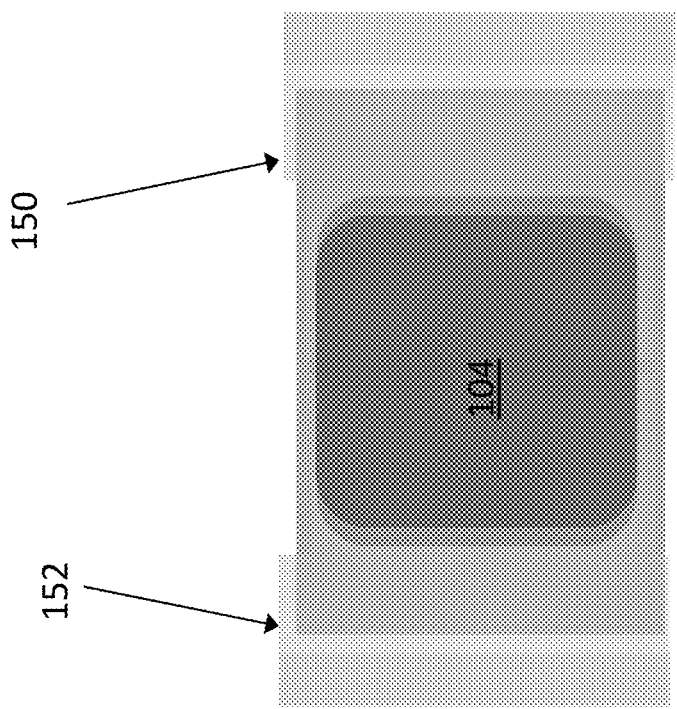
FIG. 5B
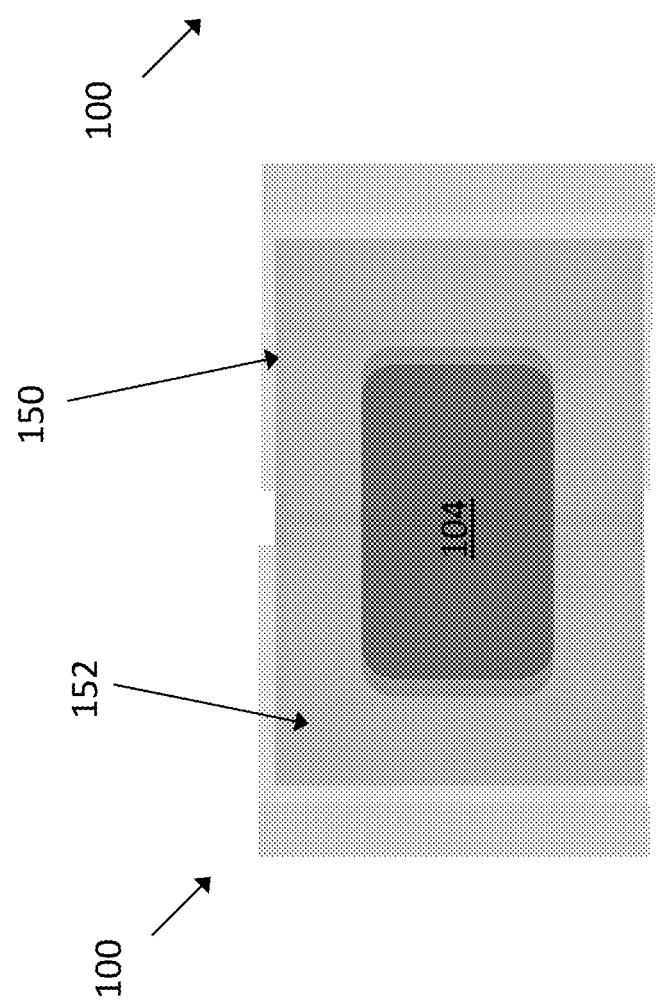
FIG. 5A
FIGURE 5

SEMICONDUCTOR PACKAGE WITH LOW PARASITIC CONNECTION TO PASSIVE DEVICE

BACKGROUND

Power modules are used in many applications such as automotive and industrial applications. A power module may include power devices that are rated to control large voltages and/or currents, e.g., MOSFETs (metal oxide semiconductor field effect transistors), IGBTs (insulated gate bipolar transistors), diodes, etc., and driver devices that are configured to control the power devices. A power module may also include passive electric elements, e.g., inductors, capacitors, etc., that enhance performance, e.g., power efficiency, switching speed, etc. It is desirable to provide a power module with high performance, e.g., high peak efficiency and a high load efficiency, while maintaining a small areal footprint and having robust electrical interconnections.

SUMMARY

A semiconductor assembly is disclosed. According to an embodiment, the semiconductor assembly comprises a semiconductor package that comprises first and second transistor dies embedded within a package body, the first and second transistor dies being arranged laterally side by side within the package body such that a first load terminal of the first transistor die faces an upper surface of the package body and such that a second load terminal of the second transistor die faces the upper surface of the package body, and a discrete capacitor mounted on the semiconductor package such that a first terminal of the discrete capacitor is directly over and electrically connected to the first load terminal of the first semiconductor die and such that a second terminal of the discrete capacitor is directly over and electrically connected with the second load terminal of the second semiconductor die.

Separately or in combination, the first and second transistor dies are each vertical devices, and wherein a vertical orientation of the first power transistor die is opposite to the second power transistor die.

Separately or in combination, the semiconductor package further comprises a first structured metallization layer disposed on the upper surface of the package body, wherein the first structured metallization layer comprises a first bond pad that is directly over and electrically connected to the first load terminal of the first semiconductor die, and a second bond pad that is directly over and electrically connected to the second load terminal of the second semiconductor die.

Separately or in combination, the first terminal of the discrete capacitor is adhesively conductively connected to the first bond pad, and wherein the second terminal of the discrete capacitor is adhesively conductively connected to the second bond pad.

Separately or in combination, the semiconductor package further comprises a second structured metallization layer disposed on a lower surface of the package body that is opposite the upper surface of the package body, wherein the second structured metallization layer comprises a third bond pad that is electrically connected to the first bond pad by a first through-via, and a fourth bond pad that is electrically connected to the second bond pad by a second through-via, and wherein both of the first and second transistor dies are laterally between the first and second through-vias.

Separately or in combination, the semiconductor assembly further comprises a carrier comprising an electrically insulating substrate, and a plurality of the semiconductor packages mounted on the carrier, wherein the first bond pads from each of the semiconductor packages in the plurality are electrically connected to one another by a first metal interconnect structure, and wherein the second bond pads from each of the semiconductor packages in the plurality are electrically connected to one another by a second metal interconnect structure.

Separately or in combination, one or both of the first and second metal interconnect structures are metal bars that are disposed completely above the plurality of the semiconductor packages.

Separately or in combination, one or both of the first and second metal interconnect structures are metal clips that are connected between the semiconductor packages and the carrier.

According to another embodiment, the semiconductor assembly comprises a semiconductor package that comprises a power converter circuit monolithically integrated into a package body, the power converter circuit comprising a first load terminal and a second load terminal, the first and second load terminals each facing an upper surface of the package body, and a discrete capacitor mounted on the semiconductor package such that a first terminal of the discrete capacitor is directly over and electrically connected to the first load terminal and such that a second terminal of the discrete capacitor is directly over and electrically connected with second load terminal.

Separately or in combination, the power converter circuit comprises first and second transistor dies embedded within the package body, wherein the first and second transistor dies are each configured as a discrete power MOSFET, wherein the first load terminal corresponds to a drain terminal of the first transistor die, and wherein the second load terminal corresponds to a source terminal of the second transistor die.

Separately or in combination, the power converter circuit is configured as a half-bridge circuit, wherein the first transistor die is a high-side switch of the half-bridge circuit, and wherein the second transistor die is a low-side switch of the half-bridge circuit.

Separately or in combination, the first terminal of the discrete capacitor is a metal contact or lead that is adhesively conductively attached to the first load terminal, and wherein the second terminal of the discrete capacitor is a metal contact or lead that is adhesively conductively attached to the second load terminal.

A method of assembling a semiconductor device is disclosed. According to an embodiment, the method comprises providing a semiconductor package that comprises first and second transistor dies embedded within a package body, the first and second transistor dies being arranged laterally side by side within the package body such that a first load terminal of the first transistor die faces an upper surface of the package body and such that a second load terminal of the second transistor die faces the upper surface of the package body, and mounting a discrete capacitor on the semiconductor package such that a first terminal of the discrete capacitor is directly over and electrically connected to the first load terminal of the first semiconductor die and such that a second terminal of the discrete capacitor is directly over and electrically connected with the second load terminal of the second semiconductor die.

Separately or in combination, the semiconductor package comprises first and second bond pads disposed on an upper surface of the semiconductor package, wherein the first bond pad is directly over and electrically connected to the first load terminal of the first semiconductor die, wherein the second bond pad is directly over and electrically connected to the second load terminal of the second semiconductor die, wherein mounting the discrete capacitor comprises directly attaching the first terminal of the discrete capacitor to the first bond pad and directly attaching the second terminal of the discrete capacitor to the second bond pad.

Separately or in combination, directly attaching the first terminal of the discrete capacitor to the first bond pad comprises soldering the first terminal of the discrete capacitor to the first bond pad, and wherein directly attaching the second terminal of the discrete capacitor to the second bond pad comprises soldering the second terminal of the discrete capacitor to the second bond pad.

Separately or in combination, the method further comprises providing a circuit carrier comprising an electrically insulating substrate, mounting a plurality of the semiconductor packages on the circuit carrier, providing first and second metal interconnect structures, electrically connecting the first bond pads of the semiconductor packages to one another using the first metal interconnect structure, electrically connecting the second bond pads of the semiconductor packages to one another using the second metal interconnect structure, and mounting one of the discrete capacitors on each one of the semiconductor packages in the plurality.

Separately or in combination, providing first and second metal interconnect structures comprises providing first and second elongated metal bars, wherein electrically connecting the first bond pads of the semiconductor packages comprises arranging the first metal bar over the first bond pad from each semiconductor package in the plurality, and wherein electrically connecting the second bond pads of the semiconductor packages comprises arranging the second metal bar over the second bond pad from each semiconductor package in the plurality.

Separately or in combination, providing first and second metal interconnect structures comprises providing first and second metal clips, wherein electrically connecting the first bond pads of the semiconductor packages comprises electrically connecting the first bond pad from each semiconductor package in the plurality to the carrier using one of the first metal clips, and wherein electrically connecting the second bond pads of the semiconductor packages comprises electrically connecting the second bond pad from each semiconductor package in the plurality to the carrier using one of the second metal clips.

Separately or in combination, for each of the semiconductor packages in the plurality, the discrete capacitor is mounted on top of the first and second metal clips.

Separately or in combination, providing the first and second elongated metal clips comprises providing a clip frame that comprises groups of the first and second metal clips each being attached to a peripheral structure, wherein electrically connecting the first bond pads of the semiconductor packages and electrically connecting the second bond pads of the semiconductor packages comprises arranging the clip frame over the plurality of the semiconductor packages, and wherein the method further comprises severing the first and second metal clips from the peripheral structure.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, illustrates a cross-sectional view of a semiconductor assembly with a semiconductor package and a passive device, according to embodiments.

FIGS. 4A and 4B, illustrates a cross-sectional view of a semiconductor assembly with a semiconductor package, a passive device and metal clips, according to embodiments.

FIG. 5, which includes FIGS. 5A and 5B, illustrates a plan view of a semiconductor assembly with a semiconductor package, a passive device and metal clips, according to embodiments.

FIGS. 7A-7D, illustrates selected method steps for forming a semiconductor assembly that comprises a semiconductor package and a passive device, according to an embodiment.

FIGS. 9A-9D, illustrates selected method steps for forming a semiconductor assembly that comprises a semiconductor package and a passive device mounted thereon, according to an embodiment.

DETAILED DESCRIPTION

Embodiments of a semiconductor assembly with an advantageous arrangement of a discrete passive device mounted on top of a semiconductor package are described herein. The semiconductor package comprises first and second semiconductor dies that are embedded with an encapsulant body of the semiconductor package. Advantageously, the terminals of the discrete passive device are directly over the terminals of the semiconductor dies to which they are electrically connected. This arrangement minimizes the length of conductors between the discrete passive and the terminals of the semiconductor dies, thereby mitigating the parasitic impact of the electrical connections and leading to improved performance.

Figure 1:
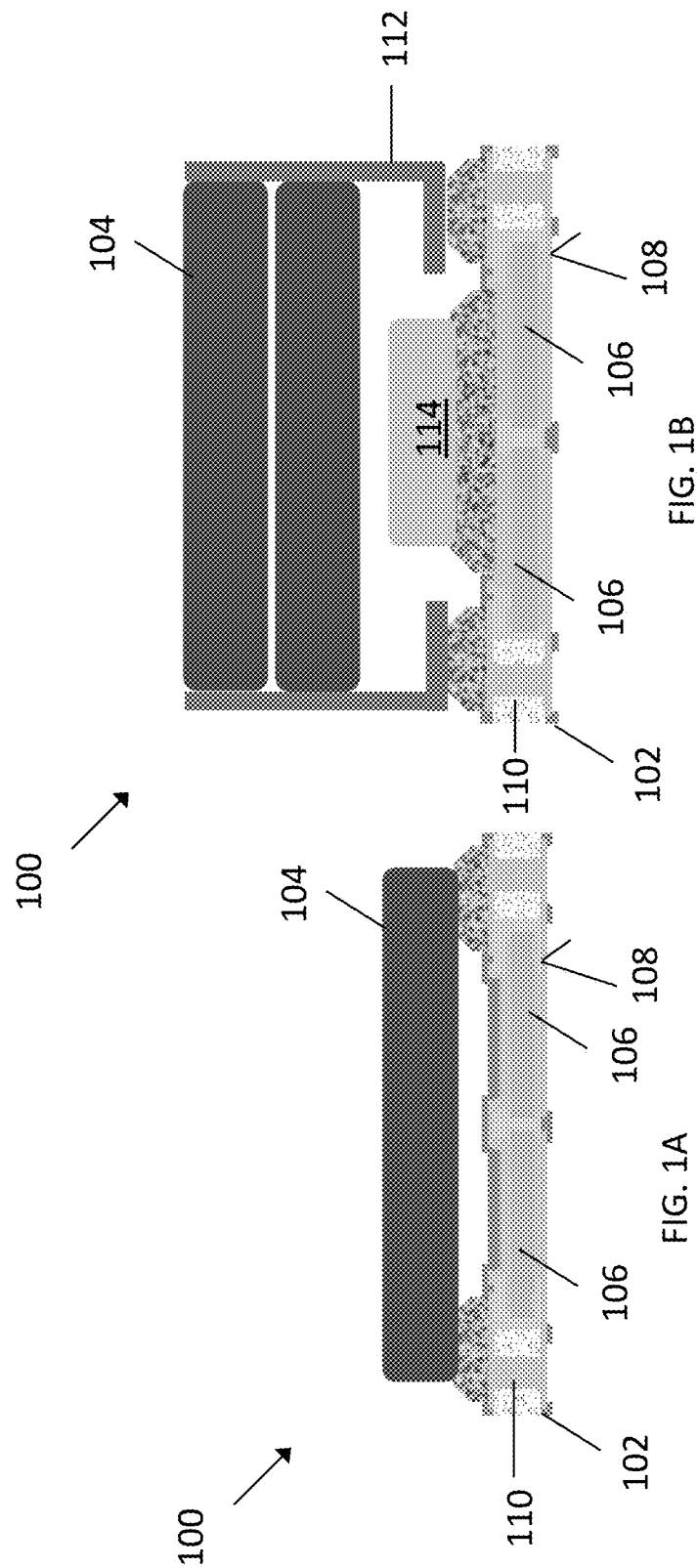
FIG. 1, which includes

Referring to FIG. 1, a semiconductor assembly 100 is depicted, according to an embodiment. The semiconductor assembly 100 comprises a semiconductor package 102 and a discrete passive device 104 mounted thereon. The semiconductor package 102 comprises a plurality of semiconductor dies 106 embedded within a package body. The discrete passive device 104 is electrically connected to terminals of the semiconductor dies 106 that face a lower surface 108 and face away from the discrete passive device 104. Vertical through via structures 110 that extend through the thickness of the semiconductor package 102 are used to complete the electrical connection between the discrete passive device 104 and the terminals of the semiconductor dies 106.

In the embodiment shown in FIG. 1A, the discrete passive device 104 is configured as a surface mount device wherein the terminals of the discrete passive device 104 are coplanar with a lower surface of the device. The embodiment shown in FIG. 1B is similar to that shown in FIG. 1A, except that the discrete passive device 104 comprises leads 112 that extend away from the body of the discrete passive device 104. The leaded configuration provides vertical clearance, which may be used to provide a metal bar 114 on the upper surface of the semiconductor package 102. The metal bar 114 may be used to lower the electrical resistance between two terminals of a semiconductor package 102.

Figure 2:
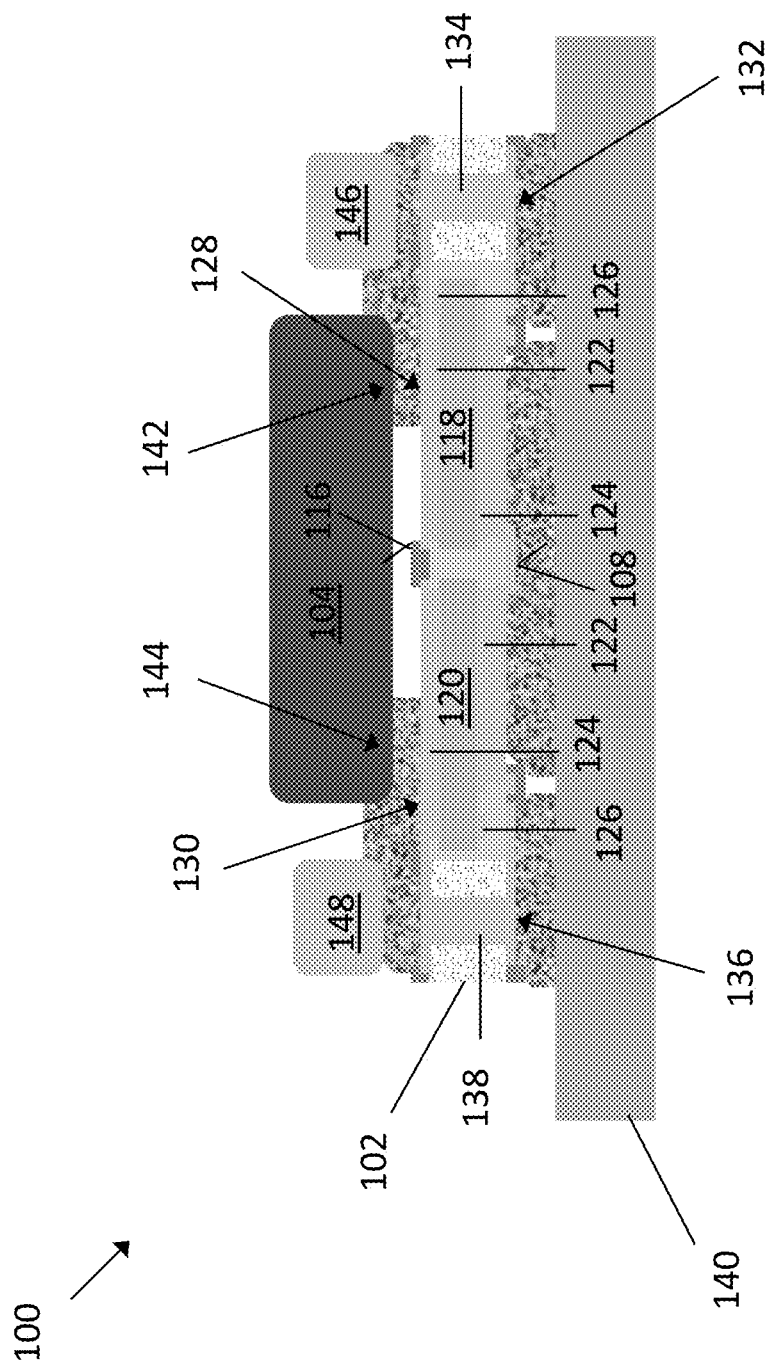
FIG. 2 illustrates a cross-sectional view of a semiconductor assembly with a semiconductor package and a passive device, according to an embodiment.

Referring to FIG. 2, a semiconductor assembly 100 is depicted, according to an embodiment. The semiconductor assembly 100 of FIG. 2 is different from that of FIG. 1 in that the terminals of the semiconductor dies that are electrically connected to the discrete passive device 104 face an upper surface 116 of the semiconductor package 102, and hence face the discrete passive device 104. This substantially shortens the distance of the electrical connection between the passive device and the semiconductor dies, and eliminates the need for interconnect elements such as the through-vias between the passive device and the semiconductor dies. This reduces the parasitic impact (e.g., inductance, resistance, etc.) of these electrical connections, and thus improves the performance of the semiconductor assembly 100.

According to an embodiment, the semiconductor package 102 is a laminated or so-called "chip-embedded" package. A chip-embedded package comprises an encapsulant body formed from multiple constituent layers of dielectric material that are laminated (stacked) on top of one another. This package type differs from a molded package wherein the encapsulant is provided by a monolithic region of mold compound that encapsulates the semiconductor die and associated electrical connectors, e.g., bond wires, clips, etc. In a chip-embedded package, each constituent laminate layer can generally comprise any dielectric material that is suitable for semiconductor device encapsulation. Examples of these dielectric materials include epoxy materials, blended epoxy and glass fiber materials such as FR-4, FR-5, CEM-4, etc., and resin materials such as bismaleimide trazine (BT) resin. A chip-embedded package may also include multiple layers of metallization, e.g., copper, aluminum, etc., and alloys thereof, formed on top of at least some of the constituent laminate layers. These layers of metallization can be structured to form internal interconnect lines within the package body as well as the bond pads that are exposed at the outer surfaces of the package body. Conductive vias, e.g., vias comprising tungsten, copper, etc., may be provided in openings that extend through the constituent layers of dielectric material to provide vertical electrical interconnect. Due to the electrical interconnect provided by the internal structured metallization, a chip-embedded package does not require a lead frame or electrical connectors such as bond wires or clips. Therefore, the semiconductor package 102 may be devoid of a die pad that accommodates the semiconductor dies and/or devoid of conductive leads that are formed from the same lead frame structure as a die pad.

According to an embodiment, the semiconductor package 102 comprises first and second transistor dies 118, 120 embedded within the package body. The first and second transistor dies 118, 120 are arranged laterally side by side one another within the package body. That is, the first and second transistor dies 118, 120 are arranged in a non-overlapping fashion. Each of the first and second transistor dies 118, 120 comprise a first load terminal 122, a second load terminal 124, and a control terminal 126. In a commonly known manner, the first and second transistor dies 118, 120 are configured to control a conductive connection between the first load terminal 122 and the second load terminal 124 via the control terminal 126. For example, the first and second transistor dies 118, 120 may be configured as MOSFET devices, wherein the first and second load terminals 122, 124 correspond to the source and drain terminals (or vice-versa) and the control terminal 126 corresponds to the gate terminal. In another example, the first and second transistor dies 118, 120 may be configured as IGBT devices, wherein the first and second load terminals 122, 124 correspond to the collector and emitter terminals (or vice-versa) and the control terminal 126 corresponds to the gate terminal.

According to an embodiment, the first and second transistor dies 118, 120 are configured as discrete power transistors. A discrete power transistor is a switching device that is rated to accommodate voltages of at least 100 V (volts) and more commonly on the order of 600 V, 1200V or more and/or is rated to accommodate currents of at least 1 A (amperes) and more commonly on the order of 10 A, 50 A, 100 A or more. Discrete power transistors may be MOSFETs (Metal Oxide Semiconductor Field Effect Transistors), IGBTs (Insulated Gate Bipolar Transistors), and HEMTs (High Electron Mobility Transistors), for example. The first and second transistor dies 118, 120 may internally comprise multiple ones of these device types connected in parallel with one another. The first and second transistor dies 118, 120 may include IV semiconductor materials, e.g., silicon, silicon germanium, silicon carbide, etc., and/or type III-V semiconductor materials, e.g., gallium nitride, gallium arsenide, etc.

The first and second transistor dies 118, 120 may be arranged such that a first load terminal 122 of the first transistor die faces an upper surface 118 of the package body and such that a second load terminal 124 of the second transistor die faces the upper surface 118 of the package body. The first and second transistor dies 118, 120 may be identical devices such that the first load terminal 122 of the first transistor die 118 is an opposite terminal as the second load terminal 124 of the second transistor die 120. For example, the first load terminal 122 of the first transistor die 118 may be the source terminal of a MOSFET or the collector terminal of an IGBT, whereas the second load terminal 124 of the second transistor die 120 may be the drain terminal of a MOSFET or the emitter terminal of an IGBT, or vice-versa.

According to an embodiment, the first and second transistor dies 118, 120 are each configured as vertical devices. A vertical device is configured to current flowing between a main surface and an opposite facing rear surface of the semiconductor die. That is, the load terminals are disposed on opposite sides of the semiconductor die. For example, the first and second transistor dies 118, 120 may each comprise a main surface with a control terminal 126 a first load terminal 122 disposed thereon, and a rear surface with a second load terminal 124 disposed thereon.

According to an embodiment the vertical orientation of the first transistor die 118 is opposite to the second transistor die 120. That is, the first and second transistor dies 118, 120 are arranged such that the load terminals face in opposite directions. For example, as shown, the main surface of the first transistor die 118 faces the upper surface 118 of the of the package body whereas the main surface of the second transistor die 120 faces the lower surface 108 of the package body.

The semiconductor package 102 may comprise first and second bond pads 128, 130 that are disposed on an upper surface 118 of the package body. The first bond pad 128 is an externally accessible contact surface for the first load terminal 122 of the first transistor die 118 and the second bond pad 130 is an externally accessible contact surface for the second load terminal 124 of the second transistor die 120. The semiconductor package 102 may comprise a first structured metallization layer disposed on the upper surface 118 of the package body, wherein the first and second bond pads 128, 130 correspond to structured portions of this first structured metallization layer. These structured portions may directly contact the first load terminal 122 of the first transistor die 118 and the second load terminal 124 of the second transistor die 120 or may be connected by a via structure. In another embodiment, the first and second bond pads 128, 130 may correspond to portions of the first load terminal 122 of the first transistor die 118 and the second load terminal 124 of the second transistor die 120 (i.e., die-level bond pads) that are directly exposed from the encapsulant body of the semiconductor package 102.

According to an embodiment, the semiconductor package 102 comprises a power conversion circuit that is monolithically integrated into the package body. As used herein, the term power conversion circuit refers to any type of circuit that comprises one or more switching devices and is configured to alter the signal characteristics of an electrical signal through periodic switching of the power switching device or devices. Power conversion circuits include DC to DC converters, DC to AC converters, AC to DC converters and AC to AC converters, for example. Power conversion circuits may be configured to convert between AC and DC and vice-versa, change the voltage of a signal, change the frequency of a signal, or any combination thereof. Exemplary circuit topologies for power conversion circuits include buck converters, boost converters, buck-boost converters, and inverters, to name a few. Power conversion circuits may have single phase circuit topologies, multi-phase topologies, e.g., three phase circuit topologies, and multi-stage circuit topologies, wherein one or more switching devices are provided for each phase or stage.

According to an embodiment, the semiconductor package 102 comprises a half-bridge circuit. A half-bridge circuit refers to a specific type of circuit topology that comprises a high-side switch connected in series with a low-side switch. One load terminal of the high-side switch (e.g., the drain) is connected to a first DC voltage (e.g., positive potential/ VDD), one load terminal of the low-side switch (e.g., the source) is connected to a second DC voltage (e.g., negative potential or GND), with the remaining two load terminals (e.g., the source of the high-side switch and the drain of the low-side switch) being connected together to form the output of the half-bridge circuit. The inputs of the high-side and low-side switch (e.g., the gate terminals) can be switched according to a power control scheme (e.g., pulse width modulation) to produce a desired voltage and frequency at the output of the half-bridge circuit. The above-described power conversion circuits may comprise one or more of these half-bridge circuits to perform any of the above described power conversion operations.

In an embodiment wherein the semiconductor package 102 comprises a half-bridge circuit, the first transistor die 118 may correspond to a high-side switch of the half-bridge circuit and the second transistor die 120 may correspond to a low-side switch of the half-bridge circuit. The first load terminal 122 of the first transistor die 118 may be a drain terminal that is connected to a first DC voltage terminal (e.g., positive potential/VDD) and the second load terminal 124 of the second transistor die 120 may be a source terminal that is connected to a second DC voltage terminal (e.g., negative potential or GND) of the of the half-bridge circuit. The first load terminal 122 of the second transistor die 120 and the second load terminal 124 of the first transistor die 118 may form the output of the half-bridge circuit. To this end, the semiconductor package 102 may comprise a second structured metallization layer disposed on the lower surface of the package body. The second structured metallization layer may comprise bond pads that provide electrical points of contact to the first load terminal 122 of the second transistor die 120 and the second load terminal 124 of the first transistor die 118 in a similar manner as previously described. Optionally, the second structured metallization layer may comprise a section that forms a direct electrical connection between the first load terminal 122 of the second transistor die 120 and the second load terminal 124 of the first transistor die 118. Moreover, the second structured metallization layer may comprise further bond pads (not shown) that provide electrical accessibility to the control terminals 126 of the first and second transistor dies 118, 120. These further bond pads may be electrically connected to the control terminal 126 of the first and second transistor dies 118, 120 through internal vias and/or internal structured metallization of the semiconductor package 102.

According to an embodiment, the semiconductor package 102 comprises a third bond pad 132 that is electrically connected to the first bond pad 128 by a first through-via 134 and a fourth bond pad 136 that is electrically connected to the second bond pad 130 by a second through-via 138. As a result, the second load terminal 124 of the first transistor die 118 and the first load terminal 122 of the second transistor die 120 are electrically accessible at the lower surface 108 of the package body. The third and fourth bond pads 132, 136 may be structured portions of the second structured metallization layer that forms the other bond pads on the lower surface 108 of the package body. The first and second through-vias 134, 138 may be integrally formed parts of the semiconductor package 102 that comprising, copper, aluminium, tungsten, nickel, etc., and alloys or combinations thereof. As shown, the semiconductor package 102 may configured such that both of the first and second transistor dies 118, 120 are laterally between the first and second through-vias 118, 120. As a result, a space-efficient arrangement is provided.

More generally, the semiconductor package 102 may comprise semiconductor dies embedded within the package body which have a wide variety of device configurations, e.g., discrete device configurations such as a MOSFET, IGBT, diode, etc., integrated circuit configurations such as a controller, driver, etc. These semiconductor dies may be configured as vertical devices or lateral devices that are configured to control a current flowing parallel to a main surface of the respective semiconductor die. In the case of a power conversion circuit such as a half-bridge circuit, the semiconductor package 102 may comprise a driver die that is configured to control the switching operation of the high-side switch and the low-side switch. The semiconductor package 102 may comprise one or more passive devices, e.g., capacitors, inductors, resistors, etc., monolithically integrated therein that may form part of the power conversion circuit, e.g., for smoothing, impedance matching, resonance, etc.

The semiconductor assembly 100 further comprises a carrier 140. Generally speaking, the carrier 140 can be any electronics substrate that is configured to mechanically support multiple electronic components, e.g., semiconductor packages, passives, heat sinks, etc., and may be configured accommodate or provide electrical connections between these electronic components. In an embodiment, the carrier 140 is a printed circuit board (PCB). In that case, the carrier 140 can comprise pre-peg material such as FR-4, CEM-1, G-10, etc. and a structured metallization layer, e.g., a copper metallization layer, with conductive bond pads disposed on an upper surface of the carrier 140. In another embodiment, the carrier 140 is a power electronics substrate. Examples of these power electronics substrates include DBC (direct bonded copper) substrates, AMB (active metal brazed) substrates, or an IMS (insulated metal substrate) substrates, for example. In the case of a power electronics substrate, the carrier 140 can compose an electrically insulating substrate, e.g., a ceramic substrate, and a structured metallization layer that is bonded to the substrate.

The semiconductor package 102 may be mounted on the carrier 140 with each of the bond pads formed in the second structured metallization layer being electrically connected to corresponding bond pads (not shown) of the carrier 140. A conductive adhesive, such as solder, sinter, conductive glue, etc. may be incorporated between the semiconductor package 102 and the carrier 140 to effectuate these electrical connections.

The semiconductor assembly 100 further comprises a discrete passive component 104 mounted on the upper surface 118 of the package body. The discrete passive component 104 comprises a first terminal 142 that is directly over and electrically connected to the first load terminal 122 of the first transistor die 118 and a second terminal 144 that is directly over and electrically connected to the second load terminal 124 of the second transistor die 120. The first and second terminals 142, 144 are exposed conductors of the discrete passive component 104 that present the predefined impedance of the discrete passive component 104. For example, as shown the discrete passive component 104 may be configured as a so-called SMD (surface mount device) wherein the first and second terminals 144 are planar metal contacts disposed a lower surface of the discrete passive component 104. Alternatively, the first and second terminal 142, 144 may be metal leads that extend away from the body of the discrete passive component 104.

The first terminal 142 of the discrete capacitor may be adhesively conductively connected to the first bond pad 128, and the second terminal 144 of the discrete capacitor may be adhesively conductively connected to the second bond pad 130. That is, the terminals of the discrete capacitor may be directly attached to the first and second bond pad 128, 130 using a conductive adhesive material. The conductive adhesive material may comprise solder, sinter, conductive glue, etc.

Due to the arrangement of the discrete passive component 104 and the semiconductor dies, the parasitic impact (e.g., inductance, capacitance, resistance) of the conductive connections between the discrete passive component 104 and the semiconductor dies is minimized. As the terminals of the discrete passive component 104 are directly over the load terminals of the semiconductor dies, and the only intermediary conductors to complete the electrical connections are a conductive adhesive and the bond pads, the parasitic impact of these intermediary conductors is minimized.

According to an embodiment, the discrete passive component 104 is a discrete capacitor. The capacitance of this capacitor can be used for a variety of different reasons, e.g., impedance matching, power conversion, AC signal filtering, etc. In one particular example the semiconductor package 102 is configured as a power inverter circuit, wherein the discrete passive component 104 forms the DC-link capacitor of the power inverter circuit. More generally, the discrete passive component 104 may be any type of passive component, e.g., resistor, inductor, capacitor, etc., wherein minimized parasitic influence of the electrical connections between the discrete passive component 104 and semiconductor package 102 are preferable.

Figure 3:
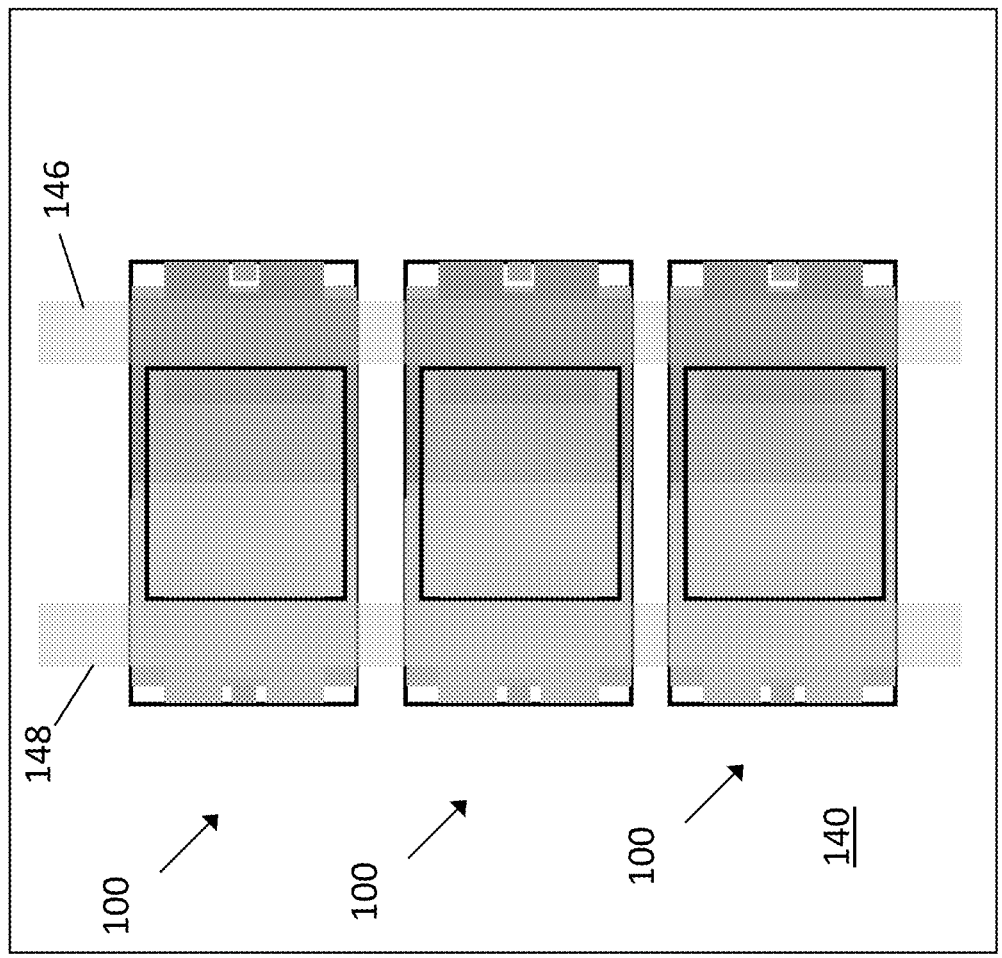
FIG. 3 illustrates a plan view of a semiconductor assembly that comprises multiple semiconductor packages and metal interconnect structures connected between the semiconductor packages, according to an embodiment.
Figure 4:
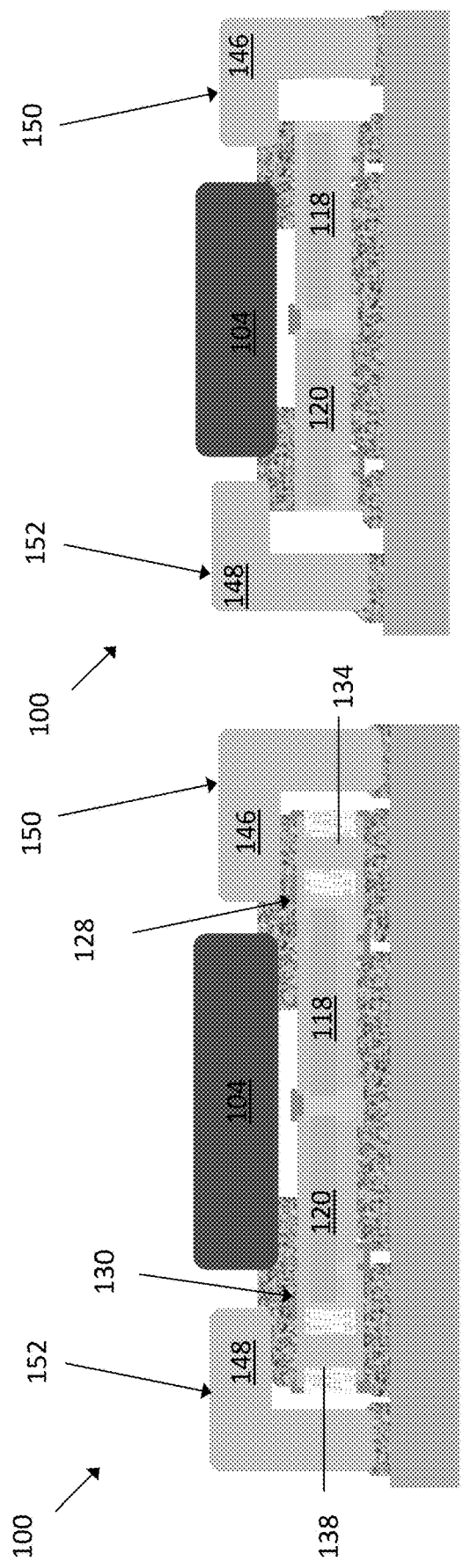
FIG. 4, which includes

According to an embodiment, the semiconductor assembly 100 additionally comprises a first metal interconnect structure 146 and a second metal interconnect structure 148. The first and second metal interconnect structures 146, 148 may comprise an electrically conductive metal such as copper, aluminium, gold, silver, zinc, nickel, tungsten, and any alloy or combination therefor. The first and second metal interconnect structures 146, 148 may each be configured as elongated bars that are disposed only above the semiconductor package 102, an example of which is shown in FIGS. 2 and 3. Alternatively, the first and second metal interconnect structures 146, 148 may each be configured as metal clips that are connected between the semiconductor package 102 and the carrier 140, an example of which is shown in FIGS. 4 and 5. The first and second metal interconnect structures 146, 148 may be electrically connected to the first and second bond pads 128, 130, respectively, by the conductive adhesive.

Referring to FIG. 3, a plan-view of a semiconductor assembly 100 that comprises plurality of the semiconductor packages 102 mounted on the carrier 140 is shown, according to an embodiment. Each of the semiconductor packages 102 may be configured identically and mounted on the carrier 140 according to any of the embodiments described with reference to FIG. 2. This arrangement may be used to form a multi-phase or multi-stage power conversion circuit. In this arrangement, each of the I/O signals and the power signals may be delivered to/from the semiconductor packages 102 via the carrier 140.

In this embodiment, the first and second metal interconnect structures 146, 148 are configured as elongated metal bars that extend across a group of the semiconductor packages 102. Moreover, the first and second metal interconnect structures 146, 148 are disposed completely above each of the semiconductor packages 102 and thus do not contact the carrier 140. In this case, the first and second metal interconnect structures 146, 148 are used to lower the resistance and stabilize the DC signal distribution to each of the semiconductor packages 102 in the group.

Referring to FIG. 4, a semiconductor assembly 100 is depicted, according to another embodiment. The semiconductor assembly 100 is substantially identical to that described with reference to FIGS. 2-3, except that the first and second metal interconnect structures 146, 148 are configured as metal clips instead of elongated metal bars. Thus, a first metal clip 150 is arranged over the first bond pad 128 and a second metal clip 152 is arranged over the second bond pad 130. These metal clips can extend across multiple semiconductor packages 100, e.g., in a similar manner as the elongated metal bars shown in FIG. 3. Alternatively, these metal clips can be associated with single ones of the semiconductor packages 100. In either case, these metal clips lower the resistance and stabilize the DC signal distribution to each of the semiconductor packages 102 in similar manner as previously described.

As shown in FIG. 4A, the metal clips may be used to supplement the conducive connections provided by the first and second through-vias 134, 138. Alternatively, as shown in FIG. 4B, the metal clips allow for the first and second through-vias 134, 138 to be omitted from the semiconductor package 102, thereby reducing the footprint of the semiconductor package 102. One arrangement may be preferred over another depending on a weighing of performance considerations, such as required size for the discrete passive element (e.g., capacitance) and electrical resistance for the DC signal connections.

Referring to FIG. 5, a planar view of the semiconductor assembly 100 described with reference to FIG. 4 is shown, according to two different embodiments. As shown, the first and second metal clips 150, 152 may have different geometries that are tailored to a particular geometry of the discrete passive component 104. In the embodiment of FIG. 5A, the first and second metal clips 150, 152 comprise recessed inner edge sides that face one another in the mounted arrangement so as to extend around edge sides of a relatively smaller discrete passive component 104. In the embodiment of FIG. 5B, the first and second metal clips 150, 152 comprise linear inner edge sides that face one another in the mounted arrangement so as to accommodate a larger discrete passive component 104.

Figure 6:
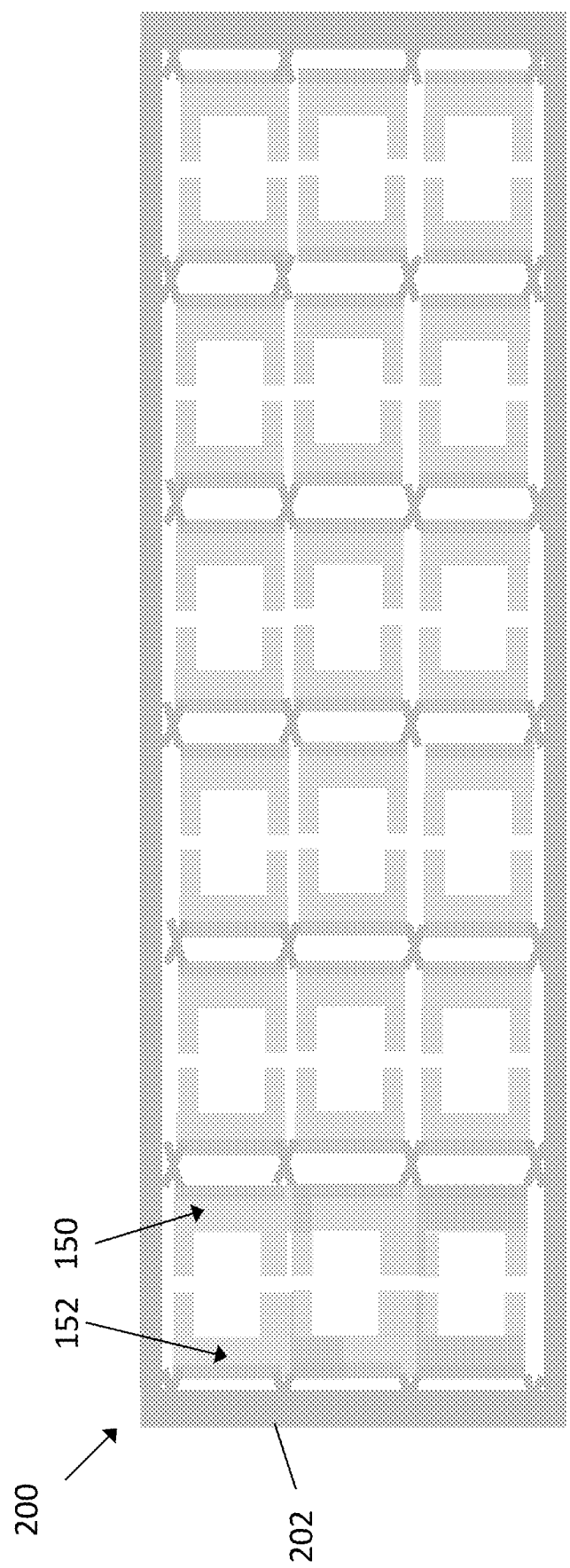
FIG. 6 illustrates a clip-frame for providing multiple metal clips, according to an embodiment.

Referring to FIG. 6, a clip frame 200 that may be used to provide the metal clips described with reference to FIGS. 4 and 5 is depicted. The clip frame 200 comprises pairs of the first and second metal clips 150, 152 that are attached to a peripheral structure 202. These pairs are arranged in a mutually opposing configuration so that the clip frame 200 can be arranged over the semiconductor package 102 and the first and second metal clips 150, 152 from each pair are positioned appropriately. Moreover, the pairs of metal clips can be arranged in groups so as to provide a multi-package assembly, e.g., as shown in FIG. 3. The clip frame 200 can comprise a conductive material such as copper (Cu), aluminium (Al), nickel (Ni), nickel phosphorous (NiP), silver (Ag), palladium (Pd) gold (Au), etc., alloys or combinations thereof. The clip frame 200 can be created by standard lead frame processing techniques. According to one technique, the clip frame 200 is provided from a sheet of metal, e.g., a substantially uniform thickness sheet of any one or combination of the above-listed metals, and the various features of the clip frame 200 are formed by performing techniques such as stamping, punching, etching, bending, etc.

Figure 7:
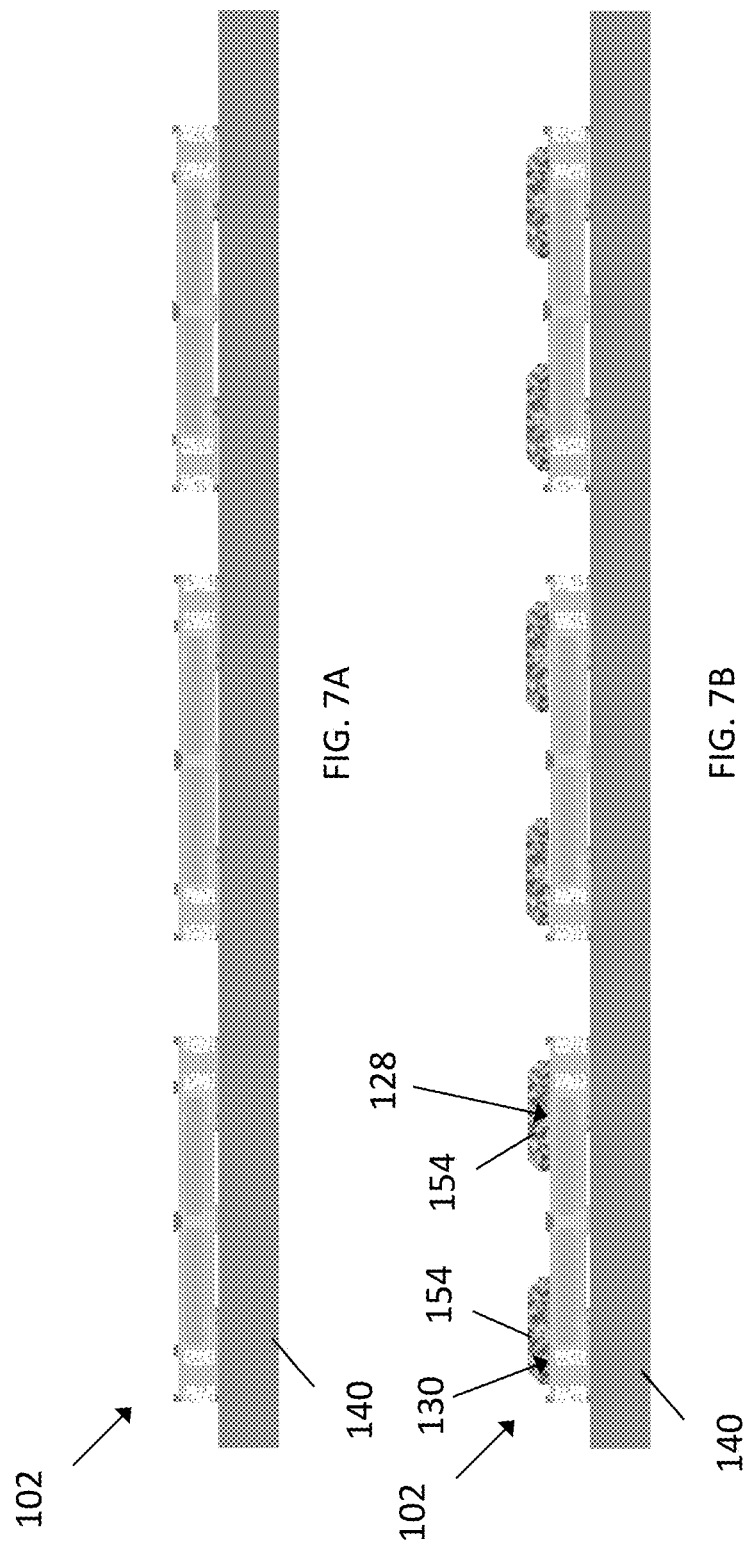
FIG. 7, which includes
Figure 7:
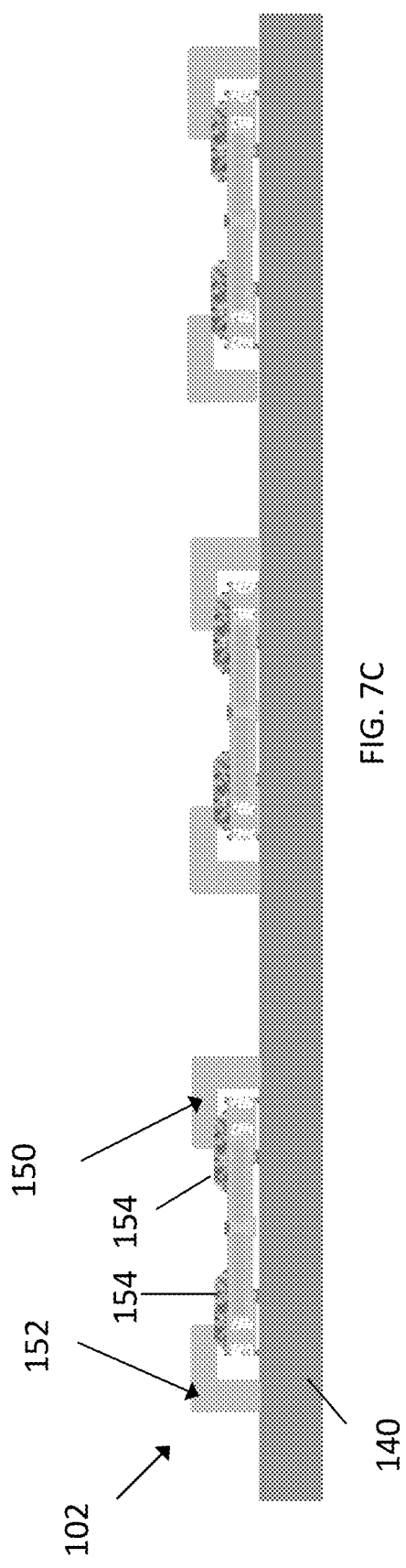
Figure 7:
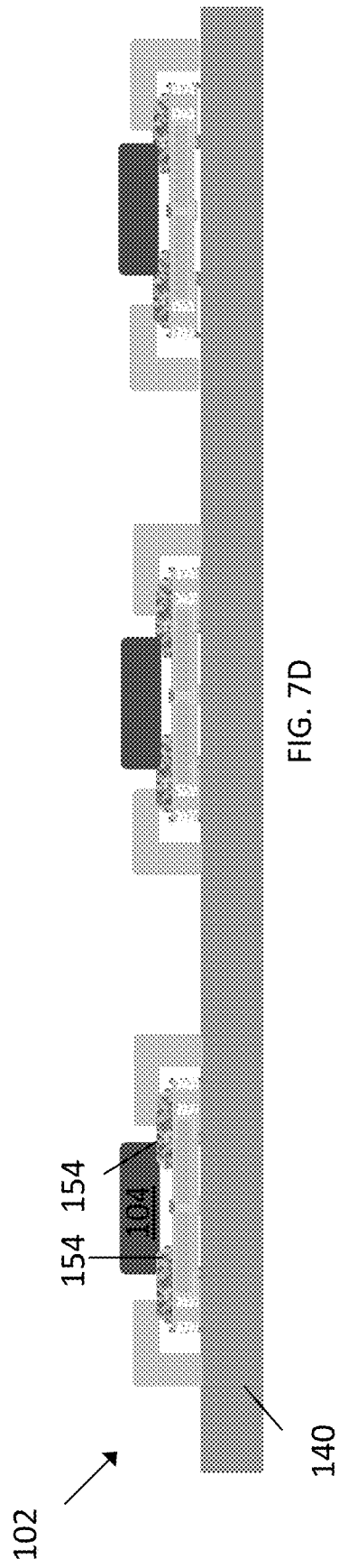

Referring to FIG. 7, a method of assembling a semiconductor device is depicted, according to an embodiment. This method may be used to produce the semiconductor assembly 100 according to any of the embodiments described with reference to FIGS. 2-4.

Referring to FIG. 7A, a circuit carrier 140 comprising an electrically insulating substrate is provided. The carrier 140 may be a PCB or power electronics substrate (e.g., DBC, AMB, IMS, etc.) according to any of the previously described configurations. A plurality of the semiconductor packages 102 are arranged on the circuit carrier 140. A solder material may be provided between the bond pads disposed on the lower surface of the semiconductor package 102 and the circuit carrier 140. A solder reflow process may be performed at this time to form soldered joints, or these soldered joints may be formed later during a common reflow step.

Referring to FIG. 7B, regions of solder material 154 are provided on the first and second bond pad 128, 130 from each of the semiconductor package 102s. The regions of solder material 154 may be a soft solder material, e.g., an Sn based solder paste.

Referring to FIG. 7C, the first and second metal clips 150, 152 are arranged on either side of the semiconductor packages 102 so as to contact the regions of solder material. The first and second metal clips 150, 152 may also contact solder material on the carrier 140 (not shown) so as to form electrical connections with bond pads on the carrier 140. The first and second metal clips 150, 152 can be provided by arranging a clip frame 200, e.g., as described with reference to FIG. 6, over each of the semiconductor packages 102 and subsequently separating the first and second metal clips 150, 152 from the peripheral structure 202, e.g., by mechanical cutting or other separation techniques. This separation may occur before or after the solder reflow step, to be described in further detail below.

Referring to FIG. 7D, the discrete passive device 104 is arranged on the regions of solder material 154 such that terminals of the discrete passive device contact the regions of solder material 154. After arranging the discrete passive device 104 on the regions of solder material 154, a solder reflow step may be performed so as to form soldered joints from the solder material. As a result, the first and second metal clips 150, 152, the semiconductor package 102, and the discrete passive device 104 are electrically connected and securely affixed to the appropriate terminals.

Instead of using the first and second metal clips 150, 152 as shown in FIG. 7, a similar technique may be used to form an assembly wherein the first and second metal interconnect structures 146, 148 are configured as elongated metal bars, e.g., as described with reference to FIGS. 2 and 3. Instead of the clip frame 200, a similar structure comprising first and second elongated metal bars may be provided and arranged over the groups of semiconductor packages 102, and similar steps as described above may be performed.

Figure 8:
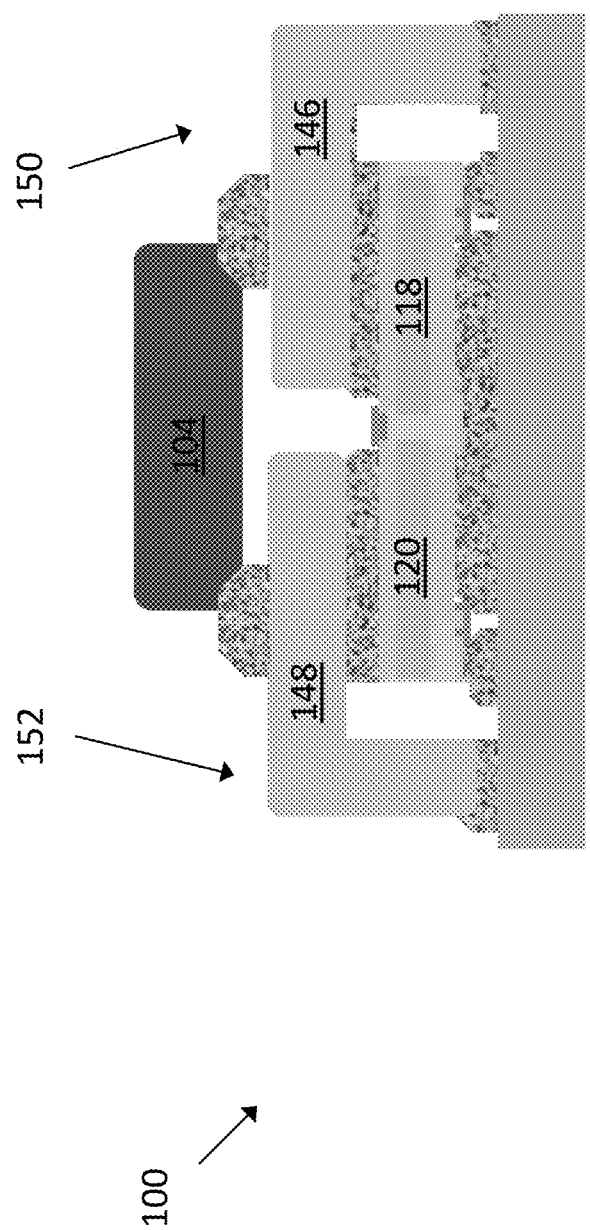
FIG. 8 illustrates a cross-sectional view of a semiconductor assembly with a semiconductor package and a passive device, according to an embodiment.

Referring to FIG. 8, semiconductor assembly 100 is depicted, according to another embodiment. The semiconductor assembly 100 of FIG. 8 may be identical to that described with reference to FIG. 4, with the exception that the discrete passive element is mounted on top of the first and second metal clips 150, 152. This arrangement may be preferable to reduce the areal footprint required for each of the semiconductor package 102s. While the concept is generally applicable to any of the semiconductor package 102 embodiments described herein, the depicted packages correspond to the package shown in FIG. 4B, wherein the first and second through-vias 134, 138 are omitted, thus leading to further space-efficiency.

Figure 9:
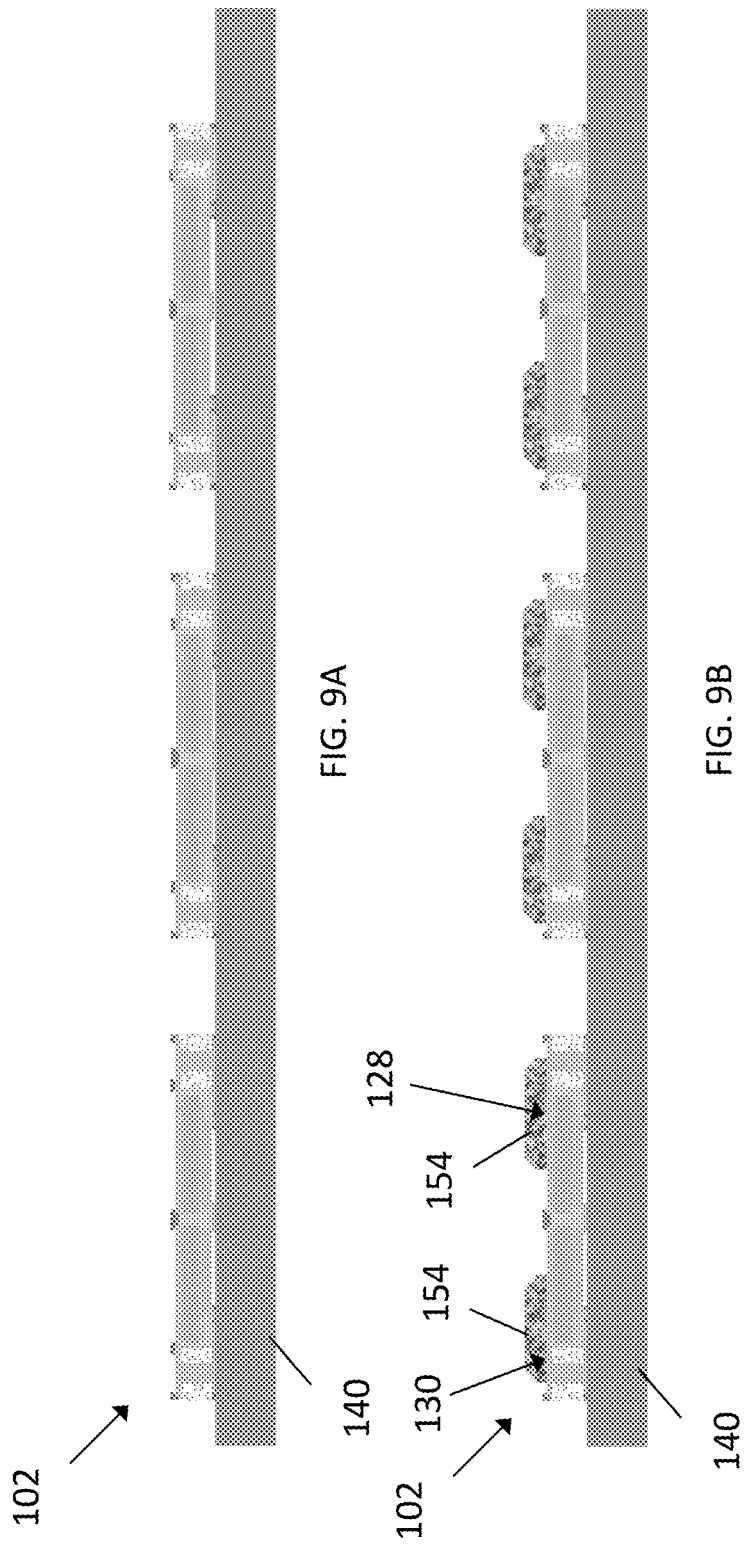
FIG. 9, which includes
Figure 9:
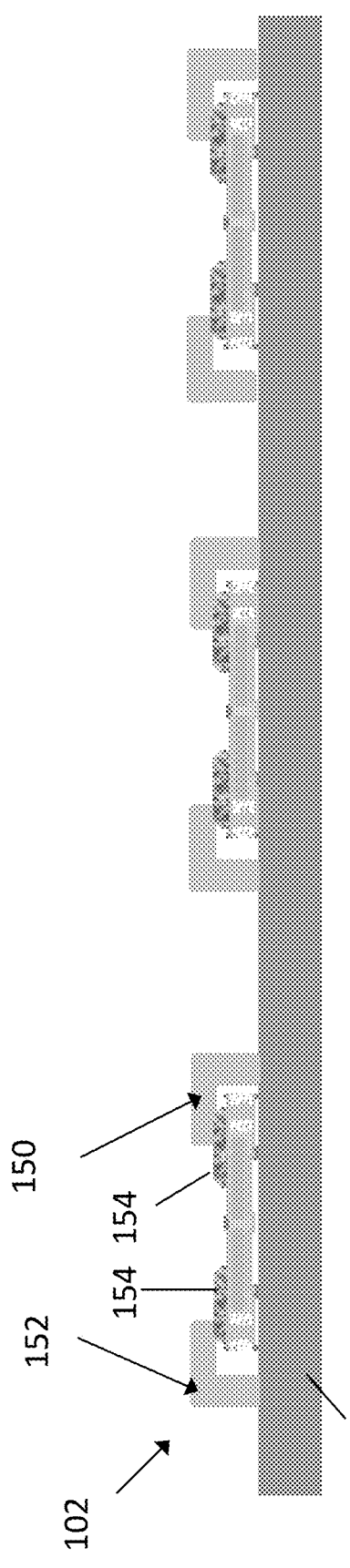
Figure 9:
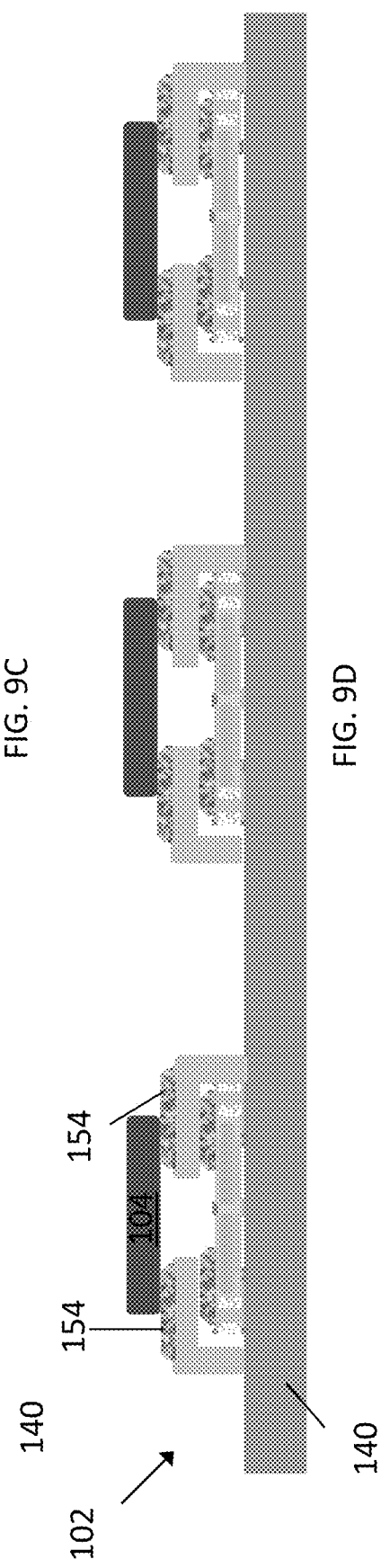

Referring to FIG. 9, a technique for forming the semiconductor assembly 100 described with reference to FIG. 8 is depicted, according to an embodiment. As shown in FIGS. 9A and 9B, the circuit carrier 140 is provided and the semiconductor package 102s are mounted on the circuit carrier 140 in a similar manner as previously described. As shown in FIG. 9C, the first and second metal clips 150, 152 are arranged on either side of the semiconductor packages 102 such that the first and second metal clips 150, 152 contact the regions of solder material 154. The geometry of the first and second metal clips 150, 152 may be different from that of the previous embodiments in that the overlapping portion of the metal clips may be larger, as there is no need to accommodate the discrete passive element 104 in between the clips. Subsequently, further regions of solder material 154 are provided on top of the first and second metal clips 150, 152 for each of the assemblies. As shown in FIG. 9D, the discrete passive element 104 is then arranged on the further regions of solder material 154. A solder reflow process may be performed to form soldered joints. According to one technique, solder reflow is performed after the step shown in FIG. 9C and a second solder reflow step is performed after the step shown in FIG. 9D. In this way, two different types of solder material may be used. Alternatively, a single solder reflow step may be performed after the step shown in FIG. 8D to form all soldered joints at the same time.

The term "electrical connection" as used herein describes a low electrical resistance and non-rectifying conduction path between two elements. An "electrical connection" may comprise multiple different electrically conductive structures such as bond pads, solder material, and conductive through-aria structures.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor assembly, comprising:
a semiconductor package that comprises first and second transistor dies embedded within a package body, the first and second transistor dies being arranged laterally side by side within the package body such that a first load terminal of the first transistor die faces an upper surface of the package body and such that a second load terminal of the second transistor die faces the upper surface of the package body, and
a discrete capacitor mounted on the semiconductor package such that a first terminal of the discrete capacitor is directly over and electrically connected to the first load terminal of the first semiconductor die and such that a second terminal of the discrete capacitor is directly over and electrically connected with the second load terminal of the second semiconductor die.

2. The semiconductor assembly of claim 1, wherein the first and second transistor dies are each vertical devices, and wherein a vertical orientation of the first power transistor die is opposite to the second power transistor die.

3. The semiconductor assembly of claim 2, wherein the semiconductor package further comprises a first structured metallization layer disposed on the upper surface of the package body, wherein the first structured metallization layer comprises a first bond pad that is directly over and electrically connected to the first load terminal of the first semiconductor die, and a second bond pad that is directly over and electrically connected to the second load terminal of the second semiconductor die.

4. The semiconductor assembly of claim 3, wherein the first terminal of the discrete capacitor is adhesively conductively connected to the first bond pad, and wherein the second terminal of the discrete capacitor is adhesively conductively connected to the second bond pad.

5. The semiconductor assembly of claim 3, wherein the semiconductor package further comprises a second structured metallization layer disposed on a lower surface of the package body that is opposite the upper surface of the package body, wherein the second structured metallization layer comprises:
a third bond pad that is electrically connected to the first bond pad by a first through-via; and
a fourth bond pad that is electrically connected to the second bond pad by a second through-via, and
wherein both of the first and second transistor dies are laterally between the first and second through-vias.

6. The semiconductor assembly of claim 2, further comprising:
a carrier comprising an electrically insulating substrate; and
a plurality of the semiconductor packages mounted on the carrier,
wherein the first bond pads from each of the semiconductor packages in the plurality are electrically connected to one another by a first metal interconnect structure, and
wherein the second bond pads from each of the semiconductor packages in the plurality are electrically connected to one another by a second metal interconnect structure.

7. The semiconductor assembly of claim 6, wherein one or both of the first and second metal interconnect structures are metal bars that are disposed completely above the plurality of the semiconductor packages.

8. The semiconductor assembly of claim 6, wherein one or both of the first and second metal interconnect structures are metal clips that are connected between the semiconductor packages and the carrier.

9. A semiconductor assembly, comprising:
a semiconductor package that comprises a power converter circuit monolithically integrated into a package body, the power converter circuit comprising a first load terminal and a second load terminal, the first and second load terminals each facing an upper surface of the package body; and
a discrete capacitor mounted on the semiconductor package such that a first terminal of the discrete capacitor is directly over and electrically connected to the first load terminal and such that a second terminal of the discrete capacitor is directly over and electrically connected with second load terminal.

10. The semiconductor assembly of claim 9, wherein the power converter circuit comprises first and second transistor dies embedded within the package body, wherein the first and second transistor dies are each configured as a discrete power MOSFET, wherein the first load terminal corresponds to a drain terminal of the first transistor die, and wherein the second load terminal corresponds to a source terminal of the second transistor die.

11. The semiconductor assembly of claim 10, wherein the power converter circuit is configured as a half-bridge circuit, wherein the first transistor die is a high-side switch of the half-bridge circuit, and wherein the second transistor die is a low-side switch of the half-bridge circuit.

12. The semiconductor assembly of claim 9, wherein the first terminal of the discrete capacitor is a metal contact or lead that is adhesively conductively attached to the first load terminal, and wherein the second terminal of the discrete capacitor is a metal contact or lead that is adhesively conductively attached to the second load terminal.

\* \* \* \* \*

UNITED STATES PATENT AND TRADEMARK OFFICE
CERTIFICATE OF CORRECTION

PATENT NO. : 11,973,063 B2
APPLICATION NO. : 17/379529
DATED : April 30, 2024
INVENTOR(S) : U. Medic et al.

It is certified that error appears in the above-identified patent and that said Letters Patent is hereby corrected as shown below:

In the Claims

Column 14, Line 49 (Claim 9) please change "with second" to -- with the second --

Signed and Sealed this
Second Day of July, 2024

Katherine Kelly Vidal
*Director of the United States Patent and Trademark Office*